United States Patent [19]

Hashimoto

[11] Patent Number: 4,797,725
[45] Date of Patent: Jan. 10, 1989

[54] MEMORY CELL FOR SRAM WITH A DIELECTRIC LAYER OVER A GATE ELECTRODE TO PROVIDE A PARALLEL RESISTIVE AND CAPACITIVE ELEMENT

[75] Inventor: Masashi Hashimoto, Miho, Japan

[73] Assignee: Texas Instruments Incorporated, Dallas, Tex.

[21] Appl. No.: 798,656

[22] Filed: Nov. 15, 1985

[30] Foreign Application Priority Data

Nov. 26, 1984 [JP]  Japan .................................. 59-249296

[51] Int. Cl.$^4$ ...................... H01L 29/34; H01L 27/02; H01L 29/78; H01L 29/04
[52] U.S. Cl. ........................................ 357/54; 357/51; 357/41; 357/23.5; 338/334; 361/311
[58] Field of Search ................ 357/51, 41, 54 F, 23.5; 338/334; 361/311

[56] References Cited

U.S. PATENT DOCUMENTS

| | | | |
|---|---|---|---|
| 3,264,531 | 8/1966 | Dickson | 357/76 |
| 3,781,610 | 12/1973 | Bodway | 338/334 |
| 4,416,049 | 11/1983 | McElroy | 357/51 |
| 4,458,407 | 7/1984 | Hoeg et al. | 357/23.5 |
| 4,538,244 | 8/1985 | Sugo et al. | 357/51 |
| 4,590,508 | 5/1986 | Hirakawa et al. | 357/51 |

Primary Examiner—Martin H. Edlow
Assistant Examiner—David R. Josephs
Attorney, Agent, or Firm—Richard K. Robinson; Melvin Sharp; N. Rhys Merrett

[57] ABSTRACT

A static memory cell including a pair of field-effect transistors, characterized by the provision of highly dielectric layers in combination with the field-effect transistors, wherein each of the highly dielectric layers is located directly on a polysilicon gate electrode layer formed on a silicon dioxide insulating layer bridging the channel region of each of the field-effect transistors. The gate electrode layer of one field-effect transistor is held in direct contact with the drain region of the other field-effect transistor and the two highly dielectric layers are covered with a polysilicon conductive layer electrically connected to a supply voltage source so that each field-effect transistor has its drain region connected to the supply voltage source through one dielectric layer and its gate electrode layer connected to the voltage source through the other dielectric layer. The provision of the highly dielectric layers is useful for precluding the memory cell from inviting a soft error during use of the memory cell as would otherwise be caused by alpha radiation and thus guarantee stabilized performance of the memory cell.

7 Claims, 5 Drawing Sheets

MEMORY CELL FOR SRAM WITH A DIELECTRIC LAYER OVER A GATE ELECTRODE TO PROVIDE A PARALLEL RESISTIVE AND CAPACITIVE ELEMENT

FIELD OF THE INVENTION

The present invention relates to a static memory cell composed of metal-oxide-semiconductor field-effect transistors (MOS FETs) formed on a single semiconductor substrate.

BACKGROUND OF THE INVENTION

A known static memory cell uses a pair of resistors provided in combination with a pair of field-effect transistors to form a flip-flop network. Each of these resistors is connected to the drain region of one of the field-effect transistors and the gate electrode of the other field-effect transistor so that a common junction is located between each resistor and the drain region of one field-effect transistor and between the particular resistor and the gate electrode of the other field-effect transistor. In a memory cell thus constructed generally, it is desired that the resistors have the highest possible resistance values to minimize the power dissipation of the memory cell. When such memory cells are miniaturized for a higher degree of integration density on a single substrate, the contents of the memory cells might be destroyed when the memory cells are subjected to alpha radiation at, for example, the common junctions of the field-effect transistors.

The present invention contemplates provision of an improved static memory cell to overcome such a drawback of known static memory cells of the described nature.

SUMMARY OF THE INVENTION

A static memory cell proposed by the present invention is characterized, inter alia, in that highly dielectric layers are utilized as resistance-capacitance means in substitution of the resistors connected to the field-effect transistors in a known static memory cell. (It will be understood that the term "highly dielectric layer" is used herein to denote a layer of a material having a high dielectric constant.) Each of these gate electrode layers is located directly on a polysilicon gate electrode layer formed on a silicon dioxide insulating layer bridging the channel region of each of the field-effect transistors. The gate electrode layer of one field-effect transistor is held in direct contact with the drain region of the other field-effect transistor. The two highly dielectric layers are covered with a polysilicon conductive layer electrically connected to a supply voltage source so that each field-effect transistor has its drain region connected to the supply voltage source through one dielectric layer and its gate electrode layer connected to the voltage source through the other dielectric layer.

Each of the highly dielectric layers intervening between the supply voltage source and each of the field-effect transistors constitutes a parallel resistance-capacitance network providing resistance and capacitance components as the distributed constants of the layer. The resistance component of each dielectric layer is useful for compensating for the leakage current from one field-effect transistor when the particular field-effect transistor is in the non-conduction state while the capacitance component of the layer lends itself to compensating for fluctuations in the potential on the gate electrode layer of the other field-effect transistor in the presence of noises such as typically alpha radiation applied to the memory cell.

In accordance with the present invention, there is provided a static memory cell comprising a semiconductor substrate having a plurality of doped regions formed therein, the doped regions forming part of first and second field-effect transistors, each of the first and second field-effect transistors having source and drain regions respectively constituted by two of the doped regions and a channel region extending between the source and drain regions, thin insulating layers each bridging the channel region of each of the first and second field-effect transistors, first and second gate electrode layers formed on the insulating layers, respectively, the first and second gate electrode layers forming part of the first and second field-effect transistors, respectively, and contact means providing electrical connection between the first gate electrode layer and the drain region of the second field-effect transistor and between the second gate electrode layer and the drain region of the first field-effect transistor, wherein the improvement comprises first and second resistance-capacitance means each having resistance and capacitance components, the first resistance-capacitance means being electrically coupled to the drain region of the first field-effect transistor and to the second gate electrode layer and the second resistance-capacitance means being electrically coupled to the drain region of the second field-effect transistor and to the first gate electrode layer.

BRIEF DESCRIPTION OF THE DRAWINGS

The drawbacks of a prior-art static memory cell and the features and advantages of a memory cell according to the present invention will be more clearly understood from the following description taken in conjunction with the accompanying drawings in which like reference numerals designate similar or corresponding units and elements and in which.

DESCRIPTION OF THE PRIOR ART

Figure 1:
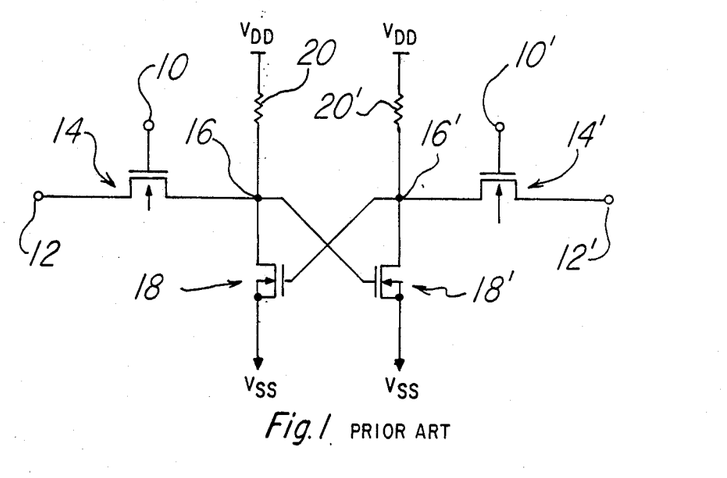
FIG. 1 is a diagram showing the equivalent circuit of a representative example of a known static memory cell formed on a semiconductor substrate.

In FIG. 1 of the drawings is shown the equivalent circuit of a known static memory cell formed on a semiconductor substrate. The memory cell herein shown is assumed to be of the four-transistor design and forms part of a memory array including word or row lines one of which is represented by cell terminals 10 and pairs of data or column lines one pair of which is represented by complementary cell terminals 12 and 12'. Though not shown in the drawings, the row line 10 leads from address input and output terminals through a row address decoder network and the column lines 12 and 12' lead to data input and output terminals through a column address decoder network as well known in the art.

The column line per se includes a pair of metal-oxide-semiconductor (MOS) field-effect transistors (hereinafter referred to as field-effect transistors) 14 and 14' each of which is to operate as a gate circuit to control the coupling between the column lines 12 and 12'. The field-effect transistor 14 has its drain and source connected between the column line 12 and a first common junction 16 and, likewise, the field-effect transistor 14' has its drain and source connected between the column line 12' and a second common junction 16'. The field-effect transistors 14 and 14' further have their respective gates jointly connected to the row line 10 and accordingly to the address input and output terminals through the row address decoder network (not shown).

The column line shown in FIG. 1 further includes a pair of field-effect transistors 18 and 18' which form part of a flip-flop network. The field-effect transistor 18 has its drain and source connected between the first common junction 16 and a ground level $V_{SS}$ and its gate connected to the second common junction 16'. Likewise, the field-effect transistor 18' has its drain and source connected between the second common junction 16' and the ground level $V_{SS}$ and its gate connected to the first common junction 16. The first and second common junctions 16 and 16' are further connected to a supply voltage source $V_{DD}$ via resistors 20 and 20', respectively.

In the static memory cell thus constructed, it is assumed that logic "1" information is stored with the field-effect transistor 18 maintained in the non-conduction state and the field-effect transistor 18' maintained in the conduction state. Under these conditions, a current path is established from the supply voltage source $V_{DD}$ to the ground level $V_{SS}$ via the resistor 20', second common junction 16' and field-effect transistor 14'. Only the leakage current from the field-effect transistor 18 flows through the resistor 20 so that the potential at the first common junction 16 is maintained at a high level and the potential at the second common junction 16' maintained at a low level. If the field-effect transistor 14 is shifted to the conduction state in response to an address signal supplied from an external source under these conditions, it is recognized that the memory cell is in a condition storing logic "1" information with the potential at the first common junction 16 maintained at a high level. Thus, a signal indicative of the logic "1" state of the memory cell is output from the memory device including the shown memory cell.

When the content of the memory cell is to be changed to logic "0" state, a voltage of a low level is applied to the column line 12 and a voltage of a high level applied to the column line 12' when the field-effect transistor 14 is shifted to the conduction states in response to an address signal supplied from an external source. The potential at the gate of the field-effect transistor 18 being increased with the voltage of high level applied to the column line 12' and with the field-effect transistor 14' turned on, the field-effect transistor 18 is shifted to the conduction state so that a current is allowed to flow from the supply voltage source $V_{DD}$ to the ground level $V_{SS}$ via the resistor 20, first common junction 16 and field-effect transistor 14 with a consequent decrease in the potential at the common junction 16. On the other hand, establishment of a potential of a low level on the column line 12 causes the field-effect transistor 18' to shift to the non-conduction state so that only the leakage current from the field-effect transistor 18' is allowed to flow through the resistor 20'. The field-effect transistors 18 and 18' are thereafter maintained in the conduction and nonconduction states, respectively, so that a signal indicative of the logic "0" state of the memory cell is output from the cell when the field-effect transistors 14 and 14' are turned on in response to an address signal selecting the particular memory cell.

All the component elements such as the field-effect transistors 14, 14', 18 and 18' and resistors 20 and 20' of the prior-art static memory cell as above described are integrated on a single silicon substrate. For the fabrication of such an integrated memory circuit, an insulating layer of silicon oxide is first formed on the silicon substrate. Polysilicon gate electrode layers are then deposited on this insulating layer and are patterned to complete the field-effect transistors 18 and 18'. Each of the field-effect transistors 18 and 18' is then covered with an interlevel insulating layer, on which a polysilicon resistive layer is patterned to form each of the resistors 20 and 20'. The insulating layer thus intervening between the polysilicon resistive layer and each of the gate electrode layers is formed with contact holes through which the resistors 20 and 20' are electrically connected to the gate electrode layers of the field-effect transistors 18 and 18', respectively, to construct the flip-flop network of the memory cell shown in FIG. 1.

In a static memory cell fabricated in this fashion, it is desired that the resistors 20 and 20' have as high resistance values as possible to minimize the power dissipation of the memory cell. When such memory cells are integrated on a single substrate and are miniaturized to provide an increased degree of integration density, the memory cells may invite soft errors when subjected to alpha radiations during use of the memory device. An object of the present invention is to provide an improved static memory cell adapted to overcome such a drawback of known static memory cells of the described nature as previously noted.

DESCRIPTION OF THE PREFERRED EMBODIMENT

A preferred embodiment of a static memory cell according to the present invention will be hereinafter described with reference to FIGS. 2 to 6 of the drawings.

Figure 2:
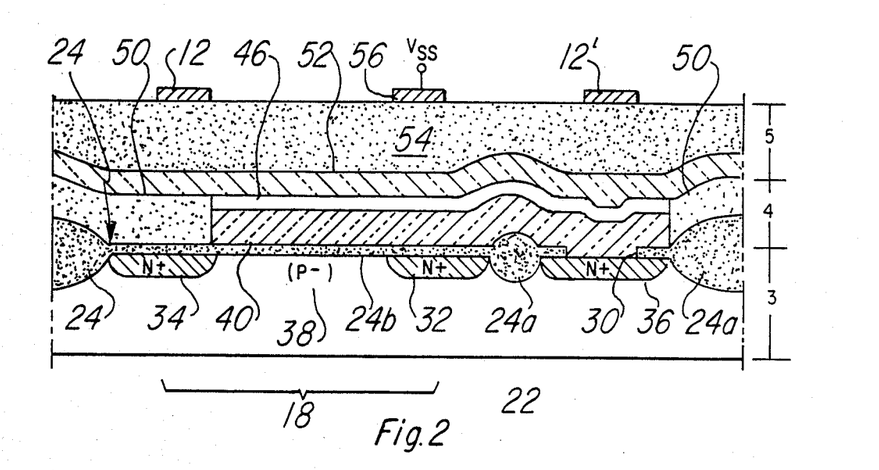
FIG. 2 is a cross sectional view showing a preferred embodiment of a static memory cell according to the present invention, the cross section taken along line II—II in each of FIGS. 3, 4, 5 and 6.
Figure 3:
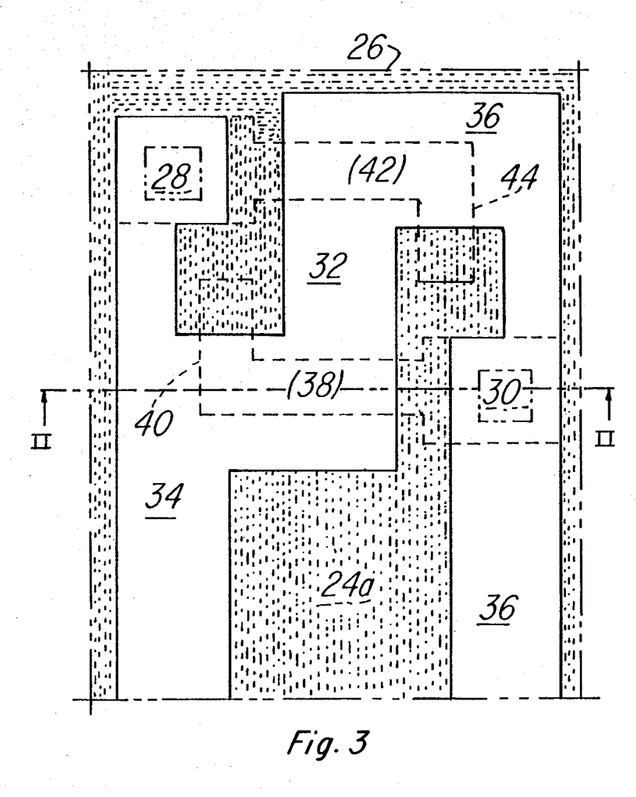
FIG. 3 is a schematic plan view showing the configuration of the memory cell shown in FIG. 2 as viewed on levels represented by III in FIG. 2.

Referring first to FIG. 2, the static memory cell embodying the present invention comprises a semiconductor substrate 22 which is assumed to be of the P-type silicon by way of example. The silicon substrate 22 has a surface layer 24 of silicon dioxide typically formed by the use of LOCOS techniques. The silicon dioxide layer 24 has thick field oxide portions 24a (represented by dot-shaded areas in FIG. 3) and thin gate oxide portions 24b surrounded by the thick regions 24a. The thick field oxide portions 24a of the layer 24 are patterned to circumscribe in the silicon substrate 22 areas 26 to form the desired field-effect transistors. The thin gate oxide portions 24b of the layer 24 defining the transistor forming areas 26 are formed with openings which define contact regions 28 and 30 on the surface of the silicon substrate 22 as shown in FIG. 3. The transistor forming areas 26 of the silicon substrate 22 include doped areas forming a common N+-type source region 32 and first and second N+-type drain regions 34 and 36, the above mentioned contact areas 28 and 30 forming part of the drain regions 34 and 36, respectively, as will be seen from FIG. 3. These source and drain regions 32, 34 and 36 are covered with the gate oxide portions 24b of the silicon dioxide layer 24 except where the openings defining the contact regions 28 and 30 on the surface of the silicon substrate 22 are located in the gate oxide Between the common source region 32 and the first drain region 34 in the silicon substrate 22 is located a channel region 38 which underlies a first polysilicon gate electrode layer 40 across the gate oxide portions 24b of the silicon dioxide layer 24 as will be gathered from FIGS. 2 and 3. Likewise, a channel region 42 is located between the common source region 32 and the second drain region 36 in the silicon substrate 22 and underlies a second polysilicon gate electrode layer 42 across the gate oxide portions 24b of the layer 24 as will be seen from FIG. 3. These first and second gate electrode layers 40 and 42 are electrically coupled with the second and first drain regions 36 and 34, respectively, in the silicon substrate 22 through the openings defining the contact regions 30 and 28 in the gate oxide portions 24b of the silicon dioxide layer 24. Thus, a first field-effect transistor is constituted by the common source region 32, first drain region 34 and first gate electrode layer 40 and, similarly, a second field-effect transistor is constituted by the common source region 32, second drain region 36 and second gate electrode layer 44. These first and second field-effect transistors correspond to the field-effect transistors 18 and 18', respectively, in the prior-art static memory cell shown in FIG. 1 and are thus herein represented by like reference numerals 10 and 10' (FIG. 6).

Figure 4:
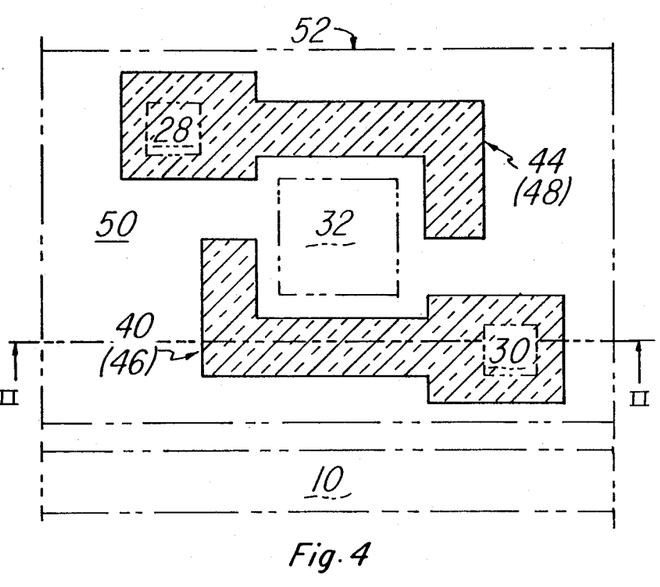
FIG. 4 is a schematic plan view showing the configuration of the memory cell shown in FIG. 2 as viewed on levels represented by IV in FIG. 2.

In a static memory cell according to the present invention, resistance-capacitance means having resistance and capacitance components is used in lieu of each of the resistors 20 and 20' in the prior-art memory cell described with reference to FIG. 1. For this purpose, the gate electrode layer 40 of the first field-effect transistor 18 is overlain by a first highly dielectric layer 46 as shown in FIG. 2 and will also seen from FIG. 4 and, likewise, the gate electrode layer 44 of the second field-effect transistor 18' is overlain by a second highly dielectric layer 48 as will be seen from FIG. 4. The first and second highly dielectric layers 46 and 48 are patterned preferably in registry with the underlying first and second gate electrode layers 40 and 44, respectively, as shown in FIG. 4 and thus each in part overlie the contact regions 28 and 30 in the gate oxide portions 24b of the silicon dioxide layer 24. In accordance with the present invention, each of these highly dielectric layers 46 and 48 is preferably constructed of ditantalum pentoxide ($Ta_2O_5$) and preferably has a thickness selected to provide a resistance which will enable each of the field-effect transistors 18 and 18' to receive from the supply voltage source $V_{DD}$ a current enough to compensate for the leakage current of the transistor and a capacitance effective to inhibit each of the field-effect transistors 18 and 18' from being caused to shift objectionably from the conduction state to the non-conduction state due to a voltage change invited by alpha radiations. Preferred values of such resistance and capacitance are about 50 gigaohms and about 60 femtofarads, respectively.

Figure 5:
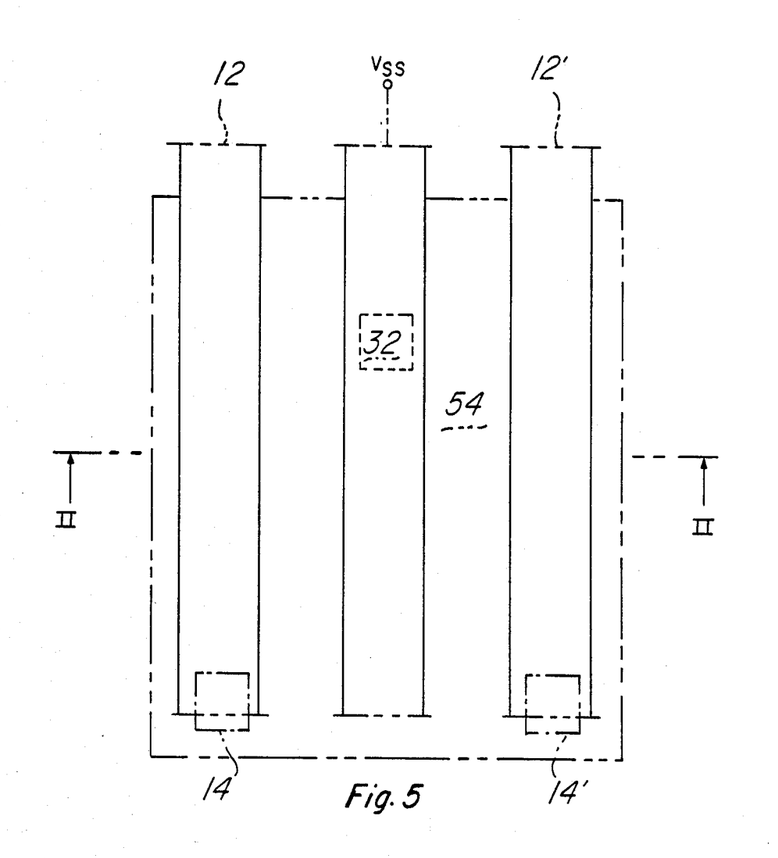
FIG. 5 is a schematic plan view showing the configuration of the memory cell shown in FIG. 2 as viewed on levels represented by V in FIG. 2.

The polysilicon gate electrode layer 40 and the associated highly dielectric layer 46 are isolated from the polysilicon gate electrode layer 44 and the associated highly dielectric layer 48 by a silicon dioxide isolation layer 50 as shown in FIG. 2. The silicon dioxide isolation layer 50 is formed in part on the thick field oxide portions 24a and in part on the thick gate oxide portions 24b of the silicon dioxide oxide layer 24 and surrounds the gate electrode layer forming part of each of the field-effect transistors 18 and 18' and the associated highly dielectric layer as will be seen from FIG. 2. The isolation layer 50 and the highly dielectric layers 46 and 48 are totally covered with a polysilicon conductive layer 52 as will be also seen from FIG. 2. The gate electrode layers 40 and 44 of the field-effect transistors 18 and 18' are thus electrically connected to the conductive layer 52 exclusively through the first and second highly dielectric layers 46 and 48, respectively, which intervene between the conductive layer 52 and the gate electrode layers 40 and 44. The conductive layer 52 is electrically connected to a suitable supply voltage source $V_{DD}$ and in turn underlies a silicon dioxide insulating layer 54 which has a pair of strips of conductor formed thereon as shown in FIG. 2 and further in FIG. 5. The conductor strips correspond to the column lines 12 and 12' in the prior-art memory cell shown in FIG. 1 and are thus represented by like reference numerals 12 and 12' in FIGS. 2 and 5. The gate electrode layers 40 and 44 are electrically connected to these conductor strips 12 and 12', respectively, across gate field-effect transistors corresponding to the field-effect transistors 14 and 14' in the prior-art memory cell shown in FIG. 1, such gate field-effect transistors being indicated schematically at 14 and 14' in FIG. 5. The silicon dioxide layer 54 further has a strip 56 of conductor formed thereon as also shown in FIGS. 2 and 5. This conductor strip 56 provides connection from the common source region 36 of the field-effect transistors 18 and 18' to the ground level $V_{SS}$.

Figure 6:
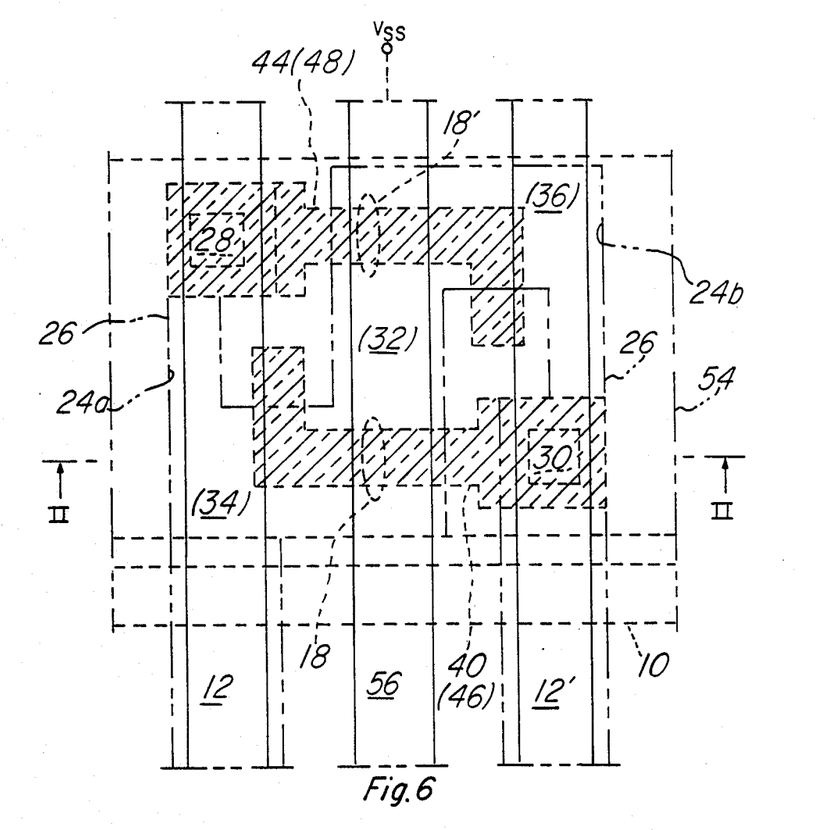
FIG. 6 is a schematic plan view showing the general configuration of the memory cell shown in FIG. 2.

FIG. 6 shows the general configuration of the static memory cell including a flip-flop network thus composed of the field-effect transistors 18 and 18' and the highly dielectric layers 46 and 48. Indicated at 10 in FIG. 6 is a conductor strip forming a row line which is connected to the gates of the field-effect transistors 14 and 14' shown in FIG. 5.

Figure 7:
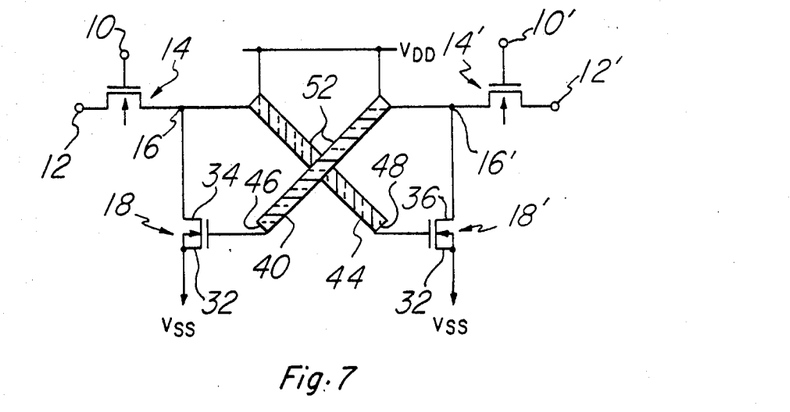
FIG. 7 is a schematic diagram showing, in analogical form, the electrical arrangement of the static memory cell embodying the present invention.

FIG. 7 of the drawings schematically shows the electrical arrangement of the static memory cell thus constructed in accordance with the present invention, wherein the gate electrode layers 40 and 44 of polysilicon, highly dielectric layers 46 and 48 of tantalum oxide and conductive layer 52 of polysilicon are indicated in analogical form. As will be seen from this FIG. 7, the first gate electrode layer 40, first highly dielectric layer 46 and conductive layer 52 provide, in combination, electrical connection between the supply voltage source $V_{DD}$ and the gate of the first field-effect transistor 18. Likewise, the second gate electrode layer 44, second highly dielectric layer 48 and conductive layer 52 provide in combination electrical connection between the supply voltage source $V_{DD}$ and the gate of the second field-effect transistor 18'. Thus, the first and second highly dielectric layers 46 and 48 are provided in substitution of the resistors 20 and 20', respectively, in the prior-art static memory cell shown in FIG. 1. The first gate electrode layer 40 and first highly dielectric layer 46 are further connected to the first common junction 16 between the field-effect transistors 14 and 18 and, similarly, the second gate electrode layer 44 and second highly dielectric layer 48 are further connected to the second common junction 16' between the field-effect transistors 14' and 18'. The first and second common junctions 16 and 16' may thus be assumed to be represented by the contact areas 28 and 30 of the drain regions 34 and 36, respectively, of the first and second field-effect transistors 18 and 18' as will be understood from the illustrations of FIGS. 2 and 7.

Figure 8:
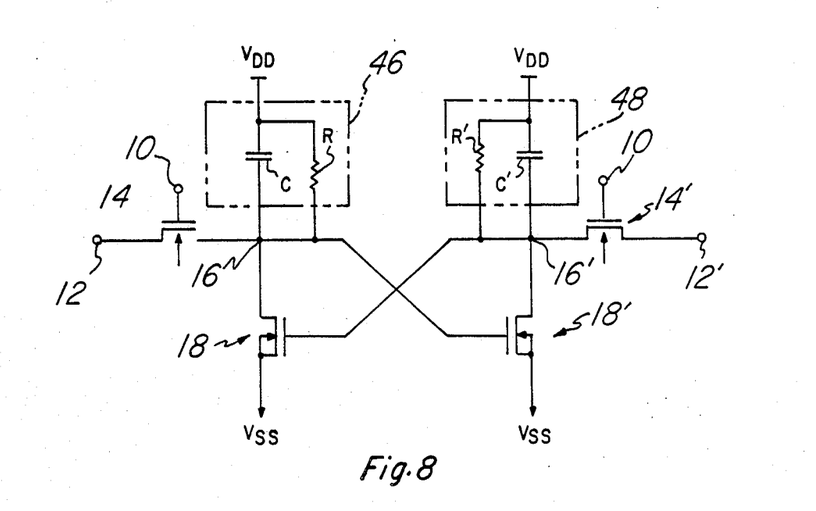
FIG. 8 is a circuit diagram similar to FIG. 1 but shows the equivalent circuit of the memory cell embodying the present invention.

FIG. 8 shows the equivalent circuit of the memory cell thus arranged. As will be seen from FIG. 8, the first highly dielectric layer 46 provides a parallel combination of a resistance R and a capacitance C between the supply voltage source $V_{DD}$ and the drain 34 of the first field-effect transistor 18 and between the supply voltage source $V_{DD}$ and the gate of the second field-effect transistor 18'. Also, the second highly dielectric layer 48 provides a parallel combination of a resistance R' and a capacitance C' between the supply voltage source $V_{DD}$ and the drain 36 of the second field-effect transistor 18' and between the supply voltage source $V_{DD}$ and the gate of the first field-effect transistor 18.

The static memory cell with the highly dielectric layers 46 and 48 thus arranged in accordance with the present invention operates similarly to the prior-art memory cell described with reference to FIG. 1 when the latter functions normally in the absence of alpha radiations incident on the memory cell.

It is now assumed, for purposes of description, that the memory cell embodying the present invention is currently in a condition memorizing logic "1"'0 information with the first field-effect transistor 18 maintained in the non-conduction state and the second field-effect transistor 18' maintained in the conduction state. If it happens under these conditions that the memory cell is subjected to alpha radiations at the first common junction 16 thereof, the bombardment of alpha particles onto the silicon lattice at the common junction 16 results in creation of electron-hole pairs by impact ionization. The electrons included in these electron-hole pairs are coupled with the positive charges which have been stored at the common junction 16 and are thus eliminated. When this occurs, the potential at the common junction 16 attempts to drop instantaneously and, if such an instantaneous drop of the potential takes place, the second field-effect transistor 18' would be caused to shift to the non-conduction state with the result that both of the first and second field-effect transistors 18 and 18' would assume the non-conduction states. Establishment of the conduction states in both of the field-effect transistors 18 and 18' results in a rise in the potential at the second common junction 16' so that it will become uncertain whichsoever field-effect transistor would be shifted to the conduction state in the next moment. If it is the first field-effect transistor 18 that is shifted to the conduction state in the next moment, the content of the memory cell would be logically inversed with the first field-effect transistor 18 in the conduction state and the second field-effect transistor 18' in the non-conduction state. In the memory cell proposed by the present invention, however, the negative carriers eliminated at the common junction 16 by the radiation of alpha rays are compensated for by the negative charges released from the capacitance component C of the first highly dielectric layer 46 connected to the common junction 16. The second field-effect transistor 18' is thus allowed to remain in the conduction state if the potential at the common junction 16 might attempt to drop instantaneously following the elimination of the negative carriers at the particular location. In this instance, the potential at the common junction 16 momentarily resumes its proper value since a current corresponding to the leakage current of the field-effect transistor 18 is supplied from the supply voltage source $V_{DD}$ to the junction 16 via the highly dielectric layers 46 and 48.

While it has been assumed that the highly dielectric layers 46 and 48 are constructed of tantalum oxide, these layers may be formed of any other material insofar as each of the layers of such a material has a conductance effective to supply each of the field-effect transistors 18 and 18' with a current corresponding to the leakage current of the transistor and a capacitance effective to compensate for fluctuations in the potential at each of the common junctions 16 and 16'. An alternative example of such a material is silicon-rich silicon dioxide.

As will have been understood from the foregoing description, a static memory cell proposed by the present invention is characterized in that highly dielectric layers 46 and 48 are utilized in substitution of the resistance layers 20 and 20' provided between a supply voltage source $V_{DD}$ and two field-effect transistors 18 and 18' forming part of a flip-flop network in a known static memory cell. Each of these highly dielectric layers 46 and 48 is positioned directly on a polysilicon gate electrode layer 40/44 formed on a silicon dioxide insulating layer 24b bridging the channel region 38/40 of each of the field-effect transistors 18 and 18'. The gate electrode layer 40/44 forming part of one field-effect transistor 18/18' is held in direct contact with and accordingly electrically connected to the drain region 36/34 of the other field-effect transistor 18'/18. The two highly dielectric layers 46 and 48 are covered with a polysilicon conductive layer 52 electrically connected to a supply voltage source $V_{DD}$ so that each field-effect transistor 18/18' has its drain region 34/36 connected to the supply voltage source $V_{DD}$ through one dielectric layer 46/48 and its gate electrode layer 40/44 connected to the supply voltage source $V_{DD}$ through the other dielectric layer 48/46.

Each of the highly dielectric layers 46 and 48 intervening between the supply voltage source $V_{DD}$ and each of the field-effect transistors 18 and 18' constitutes a parallel resistance-capacitance network providing resistance and capacitance components R/R' and C/C' as the distributed constants of the layer. The resistance component R/R' of each dielectric layer 46/48 compensates for the leakage current from one field-effect transistor 18/18' when the particular field-effect transistor is in the non-conduction state while the capacitance component C/C' of the layer 46/48 compensates for fluctuations in the potential on the gate electrode layer 44/40 of the other field-effect transistor 18'/18 in the presence of noises applied to the memory cell.

By virtue of the highly dielectric layers 46 and 48 thus arranged in a static memory cell proposed by the present invention, the following advantages are achieved:

(1) In the event the supply of a current to the source and drain regions of a field-effect transistor in a conduction state is momentarily interrupted under the influence of, typically, alpha radiations, charges are supplied from the capacitance component of the highly dielectric layer connected to the drain region of the field-effect transistor and enable the transistor to remain in the conduction state. This guarantees stabilized performance of the memory cell and precludes the memory cell from inviting a soft error during use of the memory cell as would otherwise be caused by alpha radiations.

(2) The fluctuations in the potential on each gate electrode as caused by alpha radiations are compensated for by the capacitance component of the highly dielectric layer connected thereto. The design constraints of the memory cell as would result from the antinoise requirements are thus alleviated broadly and for this reason the resistance to be interposed between the supply voltage source and the gate electrode of each of the field-effect transistors can be selected at a sufficiently large value to allow significant reduction in the power dissipation of the memory cell.

(3) The parallel resistance-capacitance network can be provided simply by forming the highly dielectric layers on the gate electrode layers and thereafter covering the dielectric layers directly with a common polysilicon conductive layer. Since the gate electrode layers per se may be arranged similarly to those in a known static memory cell, no such extra process steps are required for the patterning of the polysilicon conductive layer and the formation of additional contact regions providing electrical coupling between the conductive layer and the gate electrode layers.

It should now be borne in mind that, while only one preferred embodiment has been herein described and shown, such an embodiment is merely illustrative of the gist of the present invention and may thus be modified in numerous manners if and where desired.

What is claimed is:

1. A static memory cell in a semiconductor substrate, comprising:
   a plurality of doped regions in said substrate, providing source and drain regions of first and second field-effect transistors, said doped regions being spaced to provide respective a channel region for each of said first and second field-effect transistors,
   thin insulating layers each over a respective one of said channel regions,
   first and second gate electrodes over said thin insulating layers, respectively, the first gate electrode being connected to the drain region of the second field-effect transistor and the second gate electrode being connected to the drain region of the first field-effect transistor,
   first and second circuits each comprising a resistance and capacitance connected in parallel, the first circuit being coupled betweem a supply voltage and the drain region of said first field-effect transistor, and the second circuit being coupled between the supply voltage and the drain region of said second field-effect transistor, each of said circuits comprising a highly dielectric layer formed directly on each of said gate electrode layers.

2. A static memory cell as set forth in claim 1 further comprising electrically conductive layers over said first and second circuits.

3. A static memory cell as set forth in claim 2 wherein said highly dielectric layer is formed substantially in registry with the associated one of said gate electrode layers.

4. A static memory cell as set forth in claim 3 wherein each of said highly dielectric layers is constructed of a material having a conductance effective to supply each of said field-effect transistirs with a current corresponding to the leakage current of the transistor and a capacitance effective to compensate for possible fluctuations in the potential on each of the gate electrode layers.

5. A static memory cell as set forth in claim 3 wherein each of said highly dielectric layers comprises ditantalum pentoxide.

6. A static memory cell as set forth in claim 4 wherein the thickness of each of said highly dielectric layers provides a resistance of about 50 gigaohms and a capacitance of about 60 femtofarads.

7. A static memory cell as set forth in claim 1 wherein each of said highly dielectric layers comprise silicon-rich silicon dioxide.

* * * * *